United States Patent [19]

Protschka

[11] Patent Number: 4,778,739
[45] Date of Patent: Oct. 18, 1988

[54] PHOTORESIST PROCESS FOR REACTIVE ION ETCHING OF METAL PATTERNS FOR SEMICONDUCTOR DEVICES

[75] Inventor: Hans A. Protschka, Gaithersburg, Md.

[73] Assignee: International Business Machines Corporation, Armonk, N.Y.

[21] Appl. No.: 900,467

[22] Filed: Aug. 25, 1986

[51] Int. Cl.$^4$ ............................................... G03C 5/00
[52] U.S. Cl. ..................................... 430/30; 430/317; 430/325; 430/326; 430/329; 430/394; 156/643
[58] Field of Search .................... 430/22, 30, 313, 317, 430/323, 325, 326, 329, 331, 272; 156/643; 524/104

[56] References Cited

U.S. PATENT DOCUMENTS

| | | | |
|---|---|---|---|
| 3,985,597 | 10/1976 | Zielinski | 156/11 |
| 4,292,384 | 9/1981 | Straughan et al. | 430/5 |
| 4,362,809 | 12/1982 | Chen et al. | 430/312 |
| 4,367,119 | 1/1983 | Logan et al. | 156/643 |
| 4,464,460 | 8/1984 | Hiraoka et al. | 430/323 |
| 4,618,565 | 10/1986 | White et al. | 430/271 |

OTHER PUBLICATIONS

Havas et al., "Stripping Promoter for High Temperature Lift-Off", IBM Tech. Dis. Bull., vol. 19(4), Sep. 1976, p. 1221.
H. A. Khoury, et al., "Anti-Interference Phenomena Coating," IBM TDB, Jun. 1970, p. 38.
L. J. Puterbaugh, et al., "Stripping Method," IBM TDB, Jun. 1970, p. 44.
J. S. Logan, et al., "SiO Barrier Layer for Lift-Off Process," IBM TDB, Aug. 1977, p. 1024.
E. C. Fredericks, et al., "Polysulfone Lift-Off Masking Technique," IBM TDB, Aug. 1977, p. 989.
R. A. Lessor, et al., "Negative E-Beam Lift-Off Process," IBM TDB, Apr. 1978, pp. 4765-4766.
L. V. Gregor, et al., "Three-Layer Electron-Beam Resist with High Sensitivity and Contract," IBM TDB, Apr. 1984, p. 6141.
J. L. Logan, et al., "Dry/Wet Lift-Off Process", IBM TDB, Jul. 1984, pp. 1324-1325.

Primary Examiner—Jose G. Dees
Attorney, Agent, or Firm—John E. Hoel

[57] ABSTRACT

The process is based upon applying a layer of release agent which is a solution of a polysulfone constituent and a dye, applied to the surface of a polysilicon layer. Thereafter, the photoresist layer can be applied on top of the release agent layer. Then, the photoresist can be optically exposed and developed and its alignment measured. If the alignment of the resultant photoresist structures is found to be incorrect, rework can be easily accomplished by dissolving the release agent in a suitable solvent. This allows the existing photoresist structures to be removed. Then the rework cycle can continue by applying a new layer of the release agent and dye solution and followed by a new photoresist layer. If the original photoresist layer or the reworked photoresist layer is found to have been properly aligned, then the normal processing steps can continue. The process also provides for an improved control over back reflected and diffracted light during the optical exposure step. The presence of a dye which is selected to have an absorption cross-section which peaks at an optical wavelength approximately equal to the emission peak for the wavelength of the exposure light, enables any portion of the exposure light which passes through the photoresist and into the release layer, to be absorbed before it has a chance to be reflected or diffracted back up into the photoresist layer. This enables the photoresist to be uniformly exposed even when it passes over structures which lie beneath the release layer and which might otherwise cause unwanted reflection or diffraction of the exposure light.

2 Claims, 7 Drawing Sheets

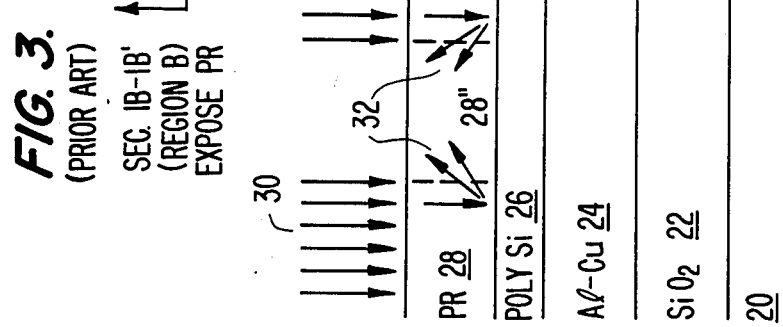
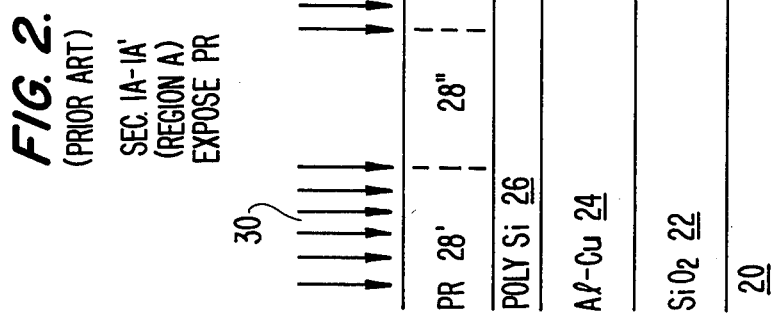
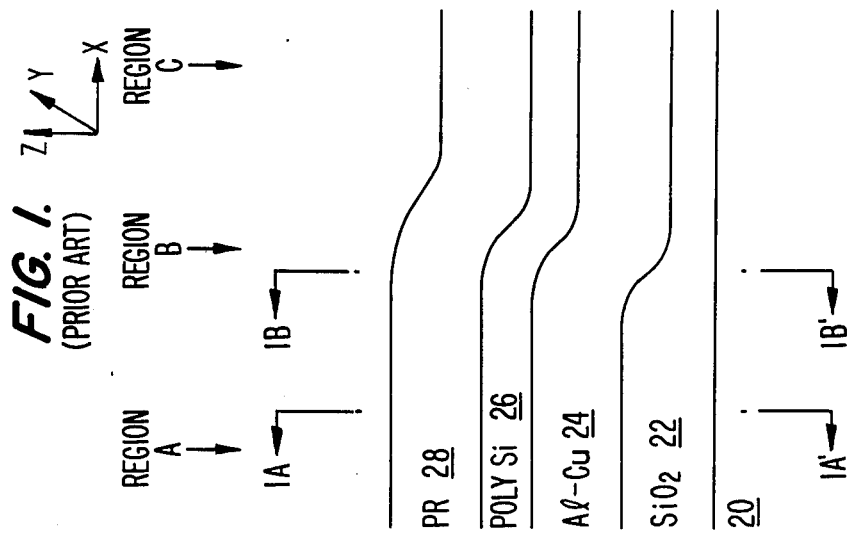

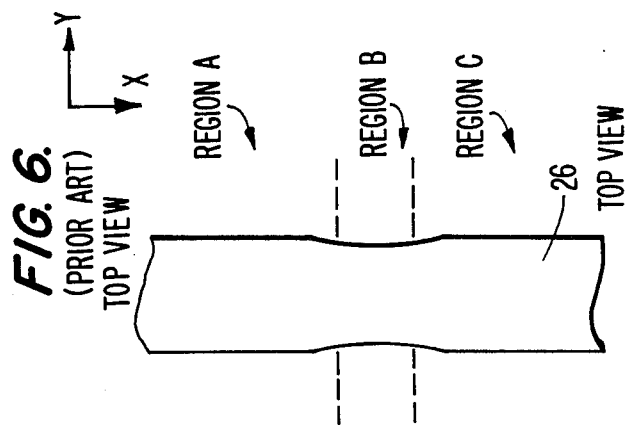
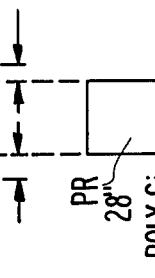
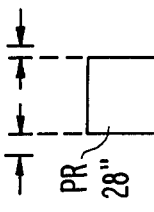

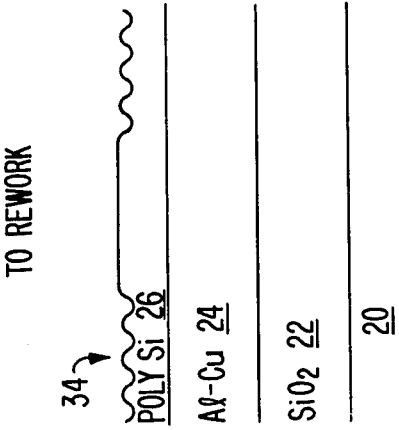
FIG. 9.
(PRIOR ART)
REMOVE PR TO REWORK
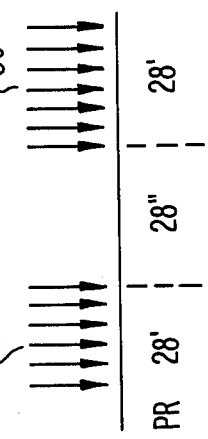
FIG. 8.
(PRIOR ART)
DEVELOP PR
FIG. 7.
(PRIOR ART)
EXPOSE PR

APPLY LAYER OF PHOTO RESIST (STEP 52)

PR 28
POLYSULFONE 40
POLY Si 26
Al-Cu 24
SiO₂ 22
20

APPLY LAYER OF RELEASE AGENT AND DYE SOL'N (STEP 50)

POLYSULFONE 40
POLY Si 26
Al-Cu 24
SiO₂ 22
20

POLY Si AND Al-Cu LAYERS TO BE ETCHED

POLY Si 26
Al-Cu 24
SiO₂ 22
20

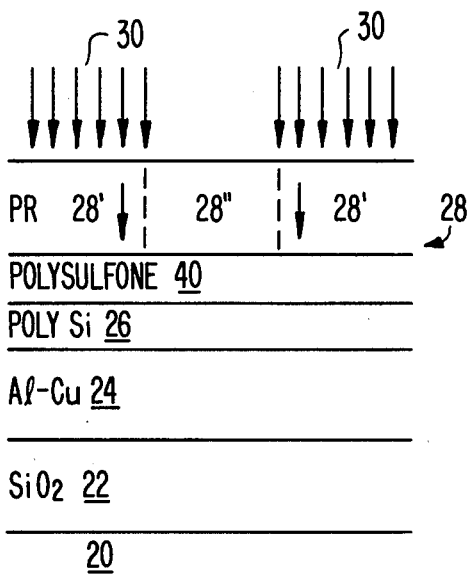
FIG. 13.
EXPOSE PHOTO RESIST (STEP 54)
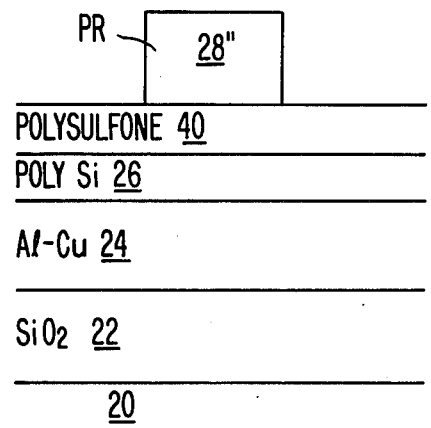
FIG. 14.
DEVELOP PHOTO RESIST (STEP 56)
FIG. 15.
REWORK BY DISSOLVING RELEASE AGENT & REMOVE PR (STEP 62)
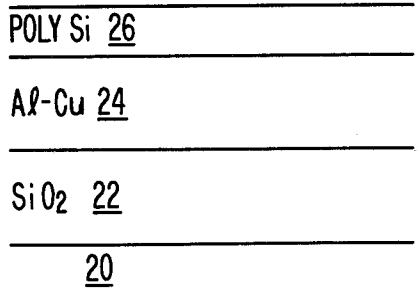
FIG. 16.
CONTINUE REWORK BY APPLYING NEW RELEASE AGENT/DYE LAYER AND NEW PR LAYER (STEP 50)

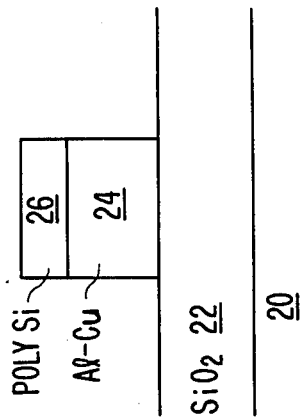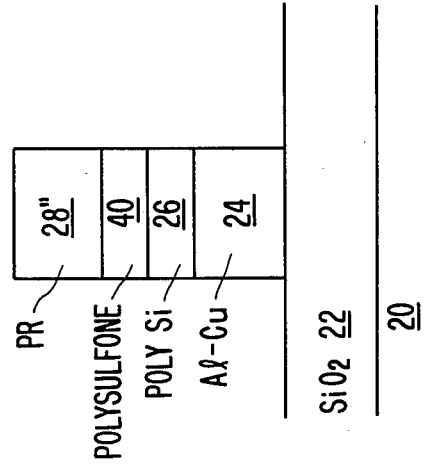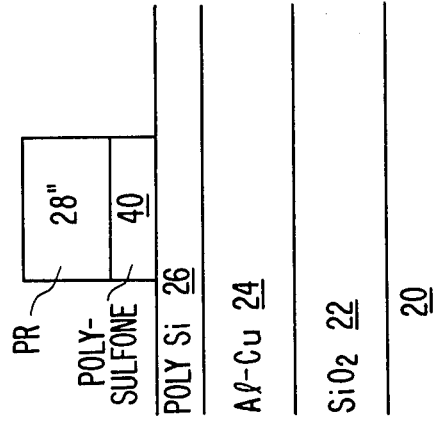

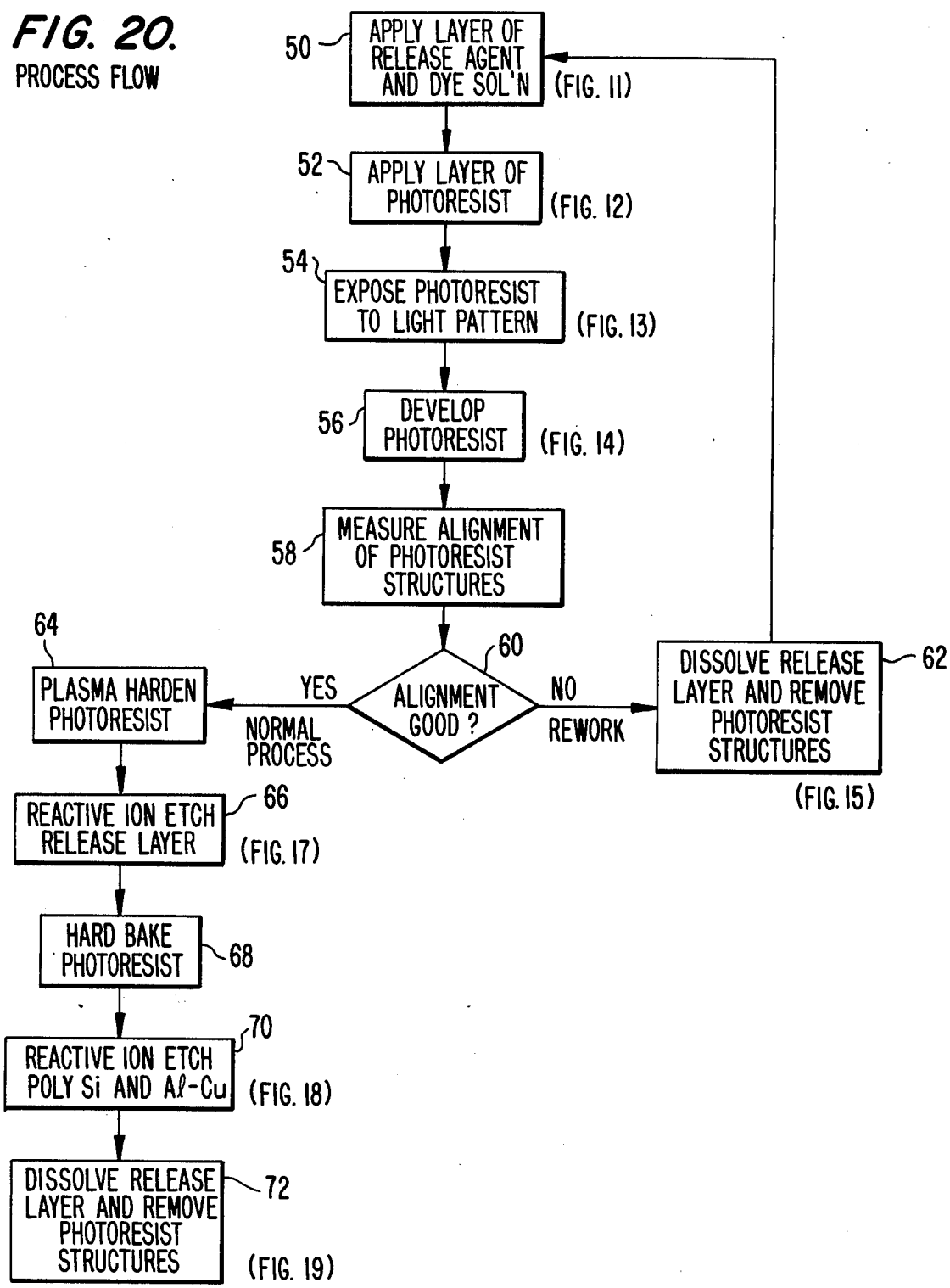
FIG. 20. PROCESS FLOW

PHOTORESIST PROCESS FOR REACTIVE ION ETCHING OF METAL PATTERNS FOR SEMICONDUCTOR DEVICES

DESCRIPTION

BACKGROUND OF THE INVENTION

1. Technical Field

The invention disclosed broadly relates to semiconductor processing and more particularly relates to improvements in photoresist techniques for reactive ion etching in semiconductor processing applications.

2. Background Art

Present reactive ion etching techniques with a single layer resist system, suffer from two deficiencies, the first is the inability to rework photoresist layers after they have been developed, and the second is the problem of variability in etched metal line widths due to reflections from substructures. Reference to FIGS. 1-6 will illustrate the problem of the prior art in the variability of line widths due to unwanted reflections from substructures. A convention is adopted in FIGS. 1-6, to illustrate the relative orientation of the views. FIG. 1 includes a set of three orthogonal coordinates x, y and z. The view in FIG. 1 is the x-z plane. FIGS. 2-5 are in the y-z plane. FIG. 6 is in the x-y plane. FIG. 1 shows a starting composite of a substrate 20 upon which lies a layer 22 of silicon dioxide, a layer 24 of an aluminum copper alloy, a layer 26 of polycrystalline silicon, on top of which has been deposited a layer 28 of a positive photoresist. The silicon dioxide layer 22 has a region C which is thinner than the region A, so that an inclined step region B must make the transition to join the region A to the region C. It is in such regions as the step region B that unwanted diffraction patterns occur in the light used to expose the photoresist layer 28, causing unwanted variations in the resulting width of the exposed portion of the photoresist and consequently the resultant width of the reactively ion etched metal lines. This can be seen with reference to FIGS. 2 and 3. FIG. 2 shows the cross-sectional view in region A along the section line 1A—1A' of FIG. 1, where it is seen that a patterned light 30 is used to expose the photoresist layer 28 so that the portions 28' are exposed and will therefore be subsequently developed and removed whereas the portion 28" is not exposed and therefore will remain in place after development. In comparing FIG. 2 with FIG. 3, FIG. 3 illustrates the cross-sectional view of the composite of FIG. 1, in the region B for the inclined step. In the region B, the exposure light 30 passes through the photoresist layer 28 and is reflected off the polysilicon and aluminum copper layer 26 and, by virtue of the inclined surface of the polysilicon layer 26 in the region B, a diffraction pattern 32 occurs causing light to pass into the central region 28" of the photoresist layer 28, thereby creating an unwanted exposure of the region 28" along its edges. FIG. 4 shows the next step in the processing of the prior art photoresist layer 28, by using a developer such as potassium hydroxide to develop the photoresist layer 28 which can be for example a novolac-type photoresist. The photoresist region 28" in region A is shown to be wider after development than the photoresist layer 28" in region B. This, as previously mentioned, is due to the diffraction pattern of light 32 which occurs in the region B, which allows the developer solution to dissolve an additional portion of the photoresist 28", thereby making it narrower. FIG. 5 shows the next step in the prior art processing technique where a reactive ion etching takes place, making use of the photoresist pattern as a mask when reactively ion etching the polysilicon layer 26 and the aluminum copper layer 24. As can be seen from FIG. 5, the resultant line width for the polysilicon layer 26 and aluminum copper layer 24 in the region B is narrower than is the resultant line width in region A. This can be better seen by the top view shown in FIG. 6 where a wider line width results for the polysilicon layer in region A than in region B. This is an undesirable feature of the prior art's technique and is a result of the lack of control of the diffracted light 32 from substructures such as that occurring in region B. The prior art has attempted to cure this problem by adding absorptive dyes to the photoresist layer 28 to reduce the amount of light reflected from the polysilicon and aluminum copper layer 26 back up into the photoresist layer 28. The problem with this prior art solution is that it reduces the photo activity of the photoresist, since the light 30 coming in from the top must be of a greater intensity in order to adequately penetrate down to the bottom of the photoresist layer 28. The presence of the absorptive dye in the photoresist layer 28 creates a large gradient in the amount of exposure which occurs between the top and the bottom of the photoresist layer and this presents problems with regard to the resultant vertical contour of metal structures etched after the development of the photoresist.

Another problem with the prior art is the inability to rework the photoresist structures once they have been exposed and developed. This is seen in the illustration of the prior art in FIGS. 7-9. In FIG. 7, the photoresist layer 28 has been applied on top of the polysilicon layer 26 as previously described and the photoresist layer is exposed to the patterned light 30 as previously described. This results in the exposure of photoresist in the region 28' which will be subsequently removed by the development step and the non-exposure of the central region 28" which will not be removed after the development step. FIG. 8 shows the development step where using conventional developers such as potassium hydroxide or sodium metasilicate which react with and dissolve the photoresist layer at the portions 28' which were exposed to the light 30 but which do not dissolve the portion 28" which was not so exposed. The problem with the development step is that the developer solutions such as potassium hydroxide also significantly etch the exposed surface of the polysilicon layer 26. The etched surface 34 shown in FIGS. 8 and 9 remains as a permanent feature of the surface of the polysilicon layer 26 after the development step. It is necessary to carry out the development step so that the remaining photoresist structures 28" can be examined by means of an optical microscope to determine their alignment relative to other structures on the integrated circuit chip. This alignment measurement is very critical since misalignment of the metal structures which are to be etched will result in shorts, opens and other failure modes throughout the integrated circuit. If it is determined that there is a misalignment, then a rework cycle must take place where the photoresist structures 28" are removed from the surface of the polysilicon layer 26 and a new layer of photoresist must be applied and exposed with the patterned light. The problem can be seen in FIG. 9 in that the inadvertently etched portion 34 for the polysilicon layer 26 remains intact and presents a difficult surface to rework because of its confusing reflectance when it is to be examined in subsequent alignment measurement steps. Typically, an integrated circuit wafer that has gone through photoresist development and which has been determined to have misaligned photoresist structures, must be scrapped because of the latent image etched into the polysilicon layer 26 by the developer.

OBJECTS OF THE INVENTION

It is therefore an object of the invention to provide an improved photoresist process for reactive ion etching of metal patterns in semiconductor devices.

It is another object of the invention to provide an improved photoresist process which minimizes the back reflection and the diffraction of light during the photoresist exposure step.

It is still a further object of the invention to provide an improved photoresist process which is capable of rework operations.

SUMMARY OF THE INVENTION

These and other objects, features and advantages of the invention are accomplished by the photoresist process disclosed herein. The process is based upon applying a layer of release agent which is a solution of a polysulfone constituent and a dye, applied to the surface of the polysilicon layer. Thereafter, the photoresist layer can be applied on top of the release agent layer. Then, the photoresist can be optically exposed and developed and its alignment measured. If the alignment of the resultant photoresist structures is found to be incorrect, rework can be easily accomplished by dissolving the release agent in a suitable solvent. This allows the existing photoresist structures to be removed without leaving a latent image in the polysilicon layer. Then the rework cycle can continue by applying a new layer of the release agent and dye solution and followed by a new photoresist layer. The new photoresist layer can then be exposed to the pattern of exposure light and can be developed and can once again be measured for its alignment. If the original photoresist layer or the reworked photoresist layer is found to be properly aligned, then the normal processing steps can continue. The normal processing steps would then be to plasma harden the photoresist followed by reactive ion etching the release layer and then hard baking the photoresist. Thereafter, the polysilicon layer and aluminum copper layer which are now masked by the composite of release layer and the photoresist, can be reactively ion etched. The resultant etched polysilicon and aluminum copper structures can then be processed by dissolving the remaining release layer and removing the remaining photoresist structures. The resultant process also provides for an improved control over back reflected and diffracted light during the optical exposure step. The presence of a dye which is selected to have an absorption cross-section which peaks at an optical wavelength approximately equal to the emission peak for the wavelength of the exposure light, enables any portion of the exposure light which passes through the photoresist and into the release layer, to be absorbed before it has a chance to be reflected or diffracted back up into the photoresist layer. This enables the photoresist to be uniformly exposed even when it passes over structures which lie beneath the release layer and which might otherwise cause unwanted reflection or diffraction of the exposure light. Further, the absence of such a dye in the photoresist layer enables a more uniform transmission of the exposure light through the photoresist layer, thereby providing a more uniform exposed condition for the photoresist.

BRIEF DESCRIPTION OF THE DRAWINGS

The foregoing and other advantages of the invention will be more fully understood with reference to the description of the best mode and the drawings wherein:

FIG. 1 is a cross-sectional view in the x-z plane of a prior art semiconductor structure showing a silicon dioxide layer 22 with a thick region A and a thin region C and an inclined region B, on top of which has been deposited aluminum copper layer 24, polysilicon layer 26, and photoresist layer 28.

FIG. 2 is a cross-sectional view in the y-z plane along section line 1A—1A' of FIG. 1, showing the exposure of the photoresist layer 28 in the region A.

FIG. 3 is a cross-sectional view in the y-z plane along section line 1B—1B' of FIG. 1, showing the exposure of the photoresist layer and the section B.

FIG. 4 is a cross-sectional view in the y-z plane showing both region A and region B mutually aligned so that the relative width of the developed photoresist 28" in region A can be compared with the relative width of the photoresist in region B.

FIG. 5 is a cross-sectional view in the y-z plane, showing the next step of reactive ion etching the polysilicon and aluminum copper layers which are masked by the photoresist layer in both region A and region B, and enables a comparison of the resultant relative width of the metal line in region A and region B.

FIG. 6 is a top view in the x-y plane of the resultant metal line showing that it is thinner in region B than it is in region A.

FIG. 7 illustrates the prior art technique of exposing the photoresist layer 28 with a patterned light source.

FIG. 8 shows the subsequent step of developing the photoresist layer so that the remaining photoresist structure 28" remains intact, and features the depiction of the inadvertently etched surface 34 for the polysilicon layer 26.

FIG. 9 shows the subsequent step in a rework cycle in the prior art where the photoresist structure 28" has been removed after it has been determined that it is misaligned, and that there is an unwanted latent image 34 which is the etched surface of the polysilicon layer 26.

FIG. 13 illustrates the next principal step of the process invention, of optically exposing the photoresist layer 28 with a patterned light 30, and the absorption of those transmitted portions of the light 30 in the underlying polysulfone layer 40.

FIG. 14 shows the next principal step of developing the photoresist layer 28, which results in leaving the photoresist structure 28" intact on top of the polysulfone layer 40.

FIG. 15 shows the stage after having performed an alignment measurement and having determined that the photoresist structures are not properly aligned, wherein the rework cycle is commenced by dissolving the release agent polysulfone layer 40 and thereby removing the photoresist structures 28".

FIG. 16 shows a continuation of the rework cycle by applying a new layer 40A of the polysulfone release agent and dye solution, followed by a new layer 28A of photoresist. The process then continues in the rework cycle by exposing the photoresist to the light pattern, developing the photoresist and, once again, making the alignment measurement.

FIG. 17 shows the continuation of the normal processing steps following the step depicted in FIG. 14, and following a step of plasma hardening the photoresist, of reactive ion etching the polysulfone release layer 40. This step would normally be followed by a hard bake step to harden the photoresist layer.

FIG. 18 illustrates the next principal step of reactive ion etching the polysilicon layer 26 and the aluminum copper layer 24 which are masked by the polysulfone layer 40 and the photoresist layer 28".

FIG. 19 illustrates the last principal step in the process, namely the dissolving of the release layer 40 in a suitable solvent so that the remaining masking photoresist structure 28" can be removed.

FIG. 20 is a process flow diagram of the inventive process, illustrating the principal steps in carrying out the process.

DESCRIPTION OF THE BEST MODE FOR CARRYING OUT THE INVENTION

Figure 12:
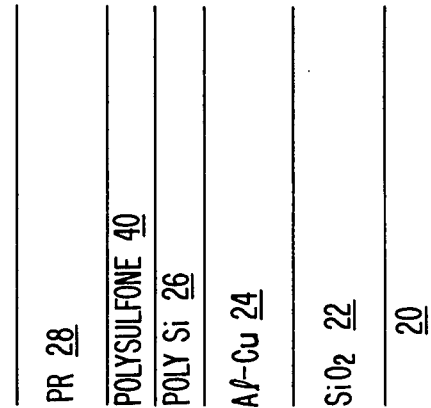
FIG. 12 shows the next principal step in the process invention, of applying a layer 28 of photoresist on top of the polysulfone layer 40.
Figure 11:
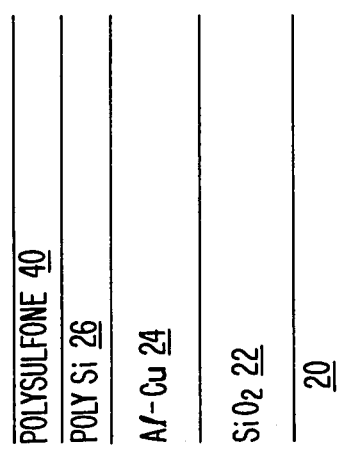
FIG. 11 shows the first principal step of the process invention, which is the application of the polysulfone layer 40 on top of the polysilicon layer 26.
Figure 10:
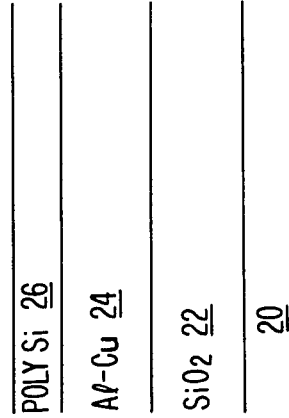
FIG. 10 shows the commencement of the processing steps for the invention disclosed herein, and illustrates a substrate 20 upon which has been deposited a layer of silicon dioxide 22 followed by a layer of aluminum copper alloy 24 followed by a layer of polysilion 26.

FIGS. 10–19 show the sequence of structures which result from the process, including the rework cycle and FIG. 20 shows the process flow for the invention. Beginning with the composite of the polysilicon layer 26, the aluminum copper layer 24, and the silicon dioxide layer 22 on top of the substrate 20, shown in FIG. 10, step 50 of the process flow continues with FIG. 11 where a layer of the release agent 40 is applied to the surface of the polysilicon layer 26. The release agent is referred to herein as polysulfone and its specific composition is as follows. An intermediate solution is made up of 45.75 percent by weight of a solvent such as N-methyl-pyrrolidone, mixed with 45.75 percent by weight of a diluent such as of di-ethylene-glycol-di-methyl-ether. To this liquid solution is added 8.5 percent by weight of a release agent such as 5003 P-poly-ether-sulfone powder. This powder can be obtained from the ICI Chemical Company in Wilmington, Del., for example. The powder is dissolved in the liquid components. The solvent component can have a weight percent range of from 35 to 55, the diluent component can have a weight percent range of from 35 to 55, and the powder component can have a weight percent range of from 4 to 15. Then to 98 weight percent of this intermediate solution is added 2 percent by weight of an appropriate optically absorptive dye having an absorption peak which is approximately the same in optical wavelength as the principal emission wavelength of the light which will be used to expose the photoresist. For example, a projection tool such as GCA 4800 DSW stepping projector can be employed, having a principal optical emission wavelength of 436 nanometers. A suitable absorptive dye for this optical wavelength is orosol yellow 4GN monoazo dye which is available, for example, from the Ciba-Geigy Corporation of Hawthorne, N.Y. The dye component can have a weight percent range of 0.5 to 5 when mixed with the intermediate solution. The resultant solution is stirred and allowed to stand for several hours and then is ready to be applied as the polysulfone release agent layer 40 of FIG. 11. A suitable thickness for the application of the polysulfone release layer 40 is approximately 0.3 microns. A typical process of application can be for example, a spin-on application step.

The process then continues with step 52 where a layer of photoresist 28 is applied to the polysulfone release layer 40, as is shown in FIG. 12. Suitable positive photoresist materials are typically of the novolac resin type, well-known to the art.

The next step 54 is to expose the photoresist layer 28 to a light pattern as is shown in FIG. 13. The resultant exposed photoresist layer is then developed with a suitable developing solution such as 0.2 normal potassium hydroxide, which will dissolve the portions 28' of the photoresist layer which have been exposed to the light 30 in the exposure step. The resultant photoresist structure 28" is shown on top of the polysulfone layer 40 in FIG. 14.

It is at this point that step 58 can be taken in FIG. 20, to measure the alignment of the photoresist structures 28" with respect to other structures on the semiconductor chip. Step 60 of FIG. 20 shows that if the alignment is not found to be correct, then the rework cycle step 62 will commence.

In the rework cycle, the release layer 40 will be dissolved by using N-methyl-pyrrolidone as a suitable solvent, and this will allow the photoresist structures 28" to float free and be easily removed. The process then returns back to step 50 of FIG. 20 where a new layer of polysulfone release agent 40A is applied followed by step 52 where a new layer 28A of photoresist is applied, as is illustrated in FIG. 16. The process flow in FIG. 20 will then continue through steps 54 and 56 so that developed photoresist structures are once again present and can be measured for appropriate alignment in step 58.

At step 60, if the alignment of the photoresist structures 28" is found to be good, then the normal processing cycle continues at step 64. Step 64 is plasma hardening step for the photoresist structure 28", where an appropriate plasma substance such as a fluorocarbon can be used in a plasma etching chamber for a quick exposure of the photoresist structure 28", hardening the structure 28" for subsequent reactive ion etching steps. Next, the normal process proceeds with step 66 where reactive ion etching of the release layer 40 is carried out. A suitable plasma etching constituent would be an oxygen plasma and a quick reactive ion etching step will remove the remaining polysulfone release layer 40, exposing the polysilicon layer 26. Next follows a hard baking step 68 which is carried out to further harden the photoresist layer. The hard baking step can be carried out at 135 degrees centigrade, resulting in a hard photoresist masking structure 28" which will serve to mask the portions of the underlying polysilicon and aluminum copper layers which are not desired to be etched in the subsequent reactive ion etching step. Step 70 then commences to reactively ion etch the polysilicon layer 26 and the aluminum copper layer 24, using a suitable reactive ion etching constituent such as a chlorinated gas mixture, well-known to the art. The structure at this point is shown in FIG. 18. In FIG. 20, the final principal step 72 of the normal process is to dissolve the release layer 40 with N-methyl-pyrrolidone, thereby allowing the remaining photoresist structure 28" to float free and to be removed. Thereafter, the wafer can be cleaned and a forming gas anneal step can take place, resulting in the final etched structure for the polysilicon layer 26 and aluminum copper layer 24, shown in FIG. 19. During this annealing step, the polysilicon becomes alloyed with the aluminum copper.

The resulting process has the advantage of providing uniform line widths because of an enhanced control over the back reflected and diffracted optical beam during photoresist exposure. The process has a further advantage that rework of the photoresist structures can occur one or more times because of the presence of the polysulfone release layer which protects the polysilicon underlying layer from being inadvertently etched by the developing solution during the development steps for the photoresist.

In an alternate embodiment of the invention, if the polysilicon layer or the metal layer or the silicon dioxide layer had many vertical projections, it would be appropriate to include a planarizing layer of material such as a modified image reversal photoresist on top of the polycrystalline silicon layer prior to the application of the polysulfone release layer 40. In addition, oftentimes it is found advantageous to apply an adhesion promoter to the polysilicon layer prior to the application of either a planarizing layer or of the polysulfone release layer, an adhesion promoter such as hexa-methyl-di-silicide is an appropriate adhesion promoter for application on the surface of the polysilicon layer 26 prior to the application of polysulfone or planarizing layers, as appropriate.

Although a specific embodiment of the invention has been disclosed, it will be understood by those of skill in the art that changes can be made to the disclosed embodiment without departing from the spirit or the scope of the invention.

What is claimed is:

1. An improved method to rework a developed photoresist layer in a reactive ion etching process, comprising the steps of:

depositing a first layer of a release layer comprising a release agent mixed with an absorptive dye to a surface of a polycrystalline silicon layer to be etched;

applying a first photoresist layer to said first release layer;

exposing said first photoresist layer to a patterned light source having a maximum emission wavelength, so that light which penetrates through said first photoresist layer will be absorbed in said first release layer;

said release layer being composed of a solution of between 4 to 15 percent by weight of poly-ether-sulfone powder, between 35 to 55 percent by weight of N-methyl-pyrrolidone, and between 35 to 55 percent by weight of a diluent, this solution then having dissolved therein a dye whose optical absorption coefficient has a maximum substantially the same as said maximum emission wavelength for said light used in said photoresist exposure step;

developing said first photoresist layer;

measuring a misalignment of the remaining photoresist structures and initiating a rework cycle;

said rework cycle including dissolving said first release layer to remove said remaining photoresist structures and depositing a replacement layer of said release layer on said polycrystalline silicon layer to be etched followed by a replacement layer of said photoresist;

exposing said replacement photoresist layer to a patterned light source having said maximum emission wavelength, so that light which penetrates through said replacement photoresist layer will be absorbed in said replacement release layer; developing said replacement photoresist layer; reactive ion etching exposed portions of said replacement release layer not masked by said replacement photoresist layer;

reactive ion etching exposed portions of said polycrystalline silicon layer not masked by said replacement photoresist layer and said replacement release layer;

dissolving said replacement release layer to remove remaining portions of said replacement photoresist layer.

2. The process of claim 1 wherein said release agent is composed of a solution of approximately 8.5 percent by weight of poly-ether-sulfone powder, approximately 45.75 percent by weight of N-methylpyrrolidone, and approximately 45.75 percent by weight of di-ethylene-glycol-di-methyl-ether, this solution then having dissolved therein a suitable dye whose optical absorption coefficient has a maximum substantially the same as the maximum emission wavelength for the light used in said photoresist exposure step.

* * * * *